(12) United States Patent
Wang et al.

(10) Patent No.: US 11,705,720 B2
(45) Date of Patent: *Jul. 18, 2023

(54) DRAIN CURRENT SENSING AND FAULT PROTECTION CIRCUIT BASED ON GATE VOLTAGE FOR GATE CURRENT DRIVEN FIELD EFFECT TRANSISTORS

(71) Applicant: University of Tennessee Research Foundation, Knoxville, TN (US)

(72) Inventors: Fei Wang, Knoxville, TN (US); Edward A. Jones, Knoxville, TN (US)

(73) Assignee: University of Tennessee Research Foundation, Knoxville, TN (US)

(*) Notice: Subject to any disclaimer, the term of this patent is extended or adjusted under 35 U.S.C. 154(b) by 0 days.

This patent is subject to a terminal disclaimer.

(21) Appl. No.: 17/664,163

(22) Filed: May 19, 2022

(65) Prior Publication Data

US 2022/0278523 A1 Sep. 1, 2022

Related U.S. Application Data

(63) Continuation of application No. 16/016,166, filed on Jun. 22, 2018, now Pat. No. 11,342,740.

(Continued)

(51) Int. Cl.
*H02H 7/122* (2006.01)
*H02H 7/12* (2006.01)
*H02M 1/08* (2006.01)
*H02H 1/00* (2006.01)
(Continued)

(52) U.S. Cl.
CPC ....... *H02H 7/1213* (2013.01); *H01L 29/7787* (2013.01); *H02H 1/0007* (2013.01);
(Continued)

(58) Field of Classification Search
CPC ............ H04L 25/026; H03K 19/00346; H03K 19/00353; H03K 19/00361; H03K 19/003; H03K 19/00307; H03K 19/00315; H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691;
(Continued)

(56) References Cited

U.S. PATENT DOCUMENTS 11,342,740 B2 * 5/2022 Wang ............... H02H 7/125
2010/0134939 A1 6/2010 Takahashi et al.
(Continued)

FOREIGN PATENT DOCUMENTS

WO WO-2017141545 A1 * 8/2017 ......... G01R 19/0053

*Primary Examiner* — Bryan R Perez
(74) *Attorney, Agent, or Firm* — Myers Bigel, P.A.

(57) ABSTRACT

A power converter circuit includes a switch including a field effect transistor, the field effect transistor being a wide bandgap field effect transistor and being configured to maintain an on operational state responsive to a maintenance signal received through a gate terminal, a current sensing circuit that is configured to estimate a drain terminal current of the field effect transistor responsive to a voltage between the gate terminal of the field effect transistor and a source terminal of the field effect transistor, and a gate driving circuit that is configured to generate the maintenance signal responsive to the estimate of the drain terminal current.

17 Claims, 6 Drawing Sheets

Related U.S. Application Data

(60) Provisional application No. 62/576,313, filed on Oct. 24, 2017.

(51) Int. Cl.
*H01L 29/778* (2006.01)
*H02H 7/125* (2006.01)
*H02M 1/32* (2007.01)
*H01L 29/20* (2006.01)
*H01L 29/417* (2006.01)
*H01L 29/10* (2006.01)
*H02M 1/00* (2006.01)

(52) U.S. Cl.
CPC ............ *H02H 7/122* (2013.01); *H02H 7/125* (2013.01); *H02M 1/08* (2013.01); *H02M 1/32* (2013.01); *H01L 29/1066* (2013.01); *H01L 29/2003* (2013.01); *H01L 29/41766* (2013.01); *H02M 1/0009* (2021.05)

(58) Field of Classification Search
CPC .... H03K 17/731; H03K 17/10; H03K 17/102; H03K 17/107; H03K 17/12; H03K 17/122; H03K 17/127; H03K 17/722; H03K 17/689; G11B 5/02; G11B 5/022
See application file for complete search history.

(56) References Cited

U.S. PATENT DOCUMENTS

2016/0301405 A1* 10/2016 Lew .................... H03K 17/145
2017/0288385 A1 10/2017 Naka et al.

* cited by examiner

DRAIN CURRENT SENSING AND FAULT PROTECTION CIRCUIT BASED ON GATE VOLTAGE FOR GATE CURRENT DRIVEN FIELD EFFECT TRANSISTORS

CROSS REFERENCE TO RELATED APPLICATION

The present application is a continuation of U.S. patent application Ser. No. 16/016,166, filed Jun. 22, 2018, which claims priority to U.S. Provisional Patent Application Ser. No. 62/576,313, filed Oct. 24, 2017, the entire content of which is incorporated by reference herein as if set forth in its entirety.

STATEMENT OF U.S. GOVERNMENT INTEREST

This invention was made with Government support under Grant No. EEC 104187 awarded by the National Science Foundation. The Government has certain rights in the invention.

FIELD OF THE INVENTION

The present invention relates to power conversion and, more particularly, to current detection and overcurrent detection in power converter circuits that operate at relatively high voltages.

BACKGROUND

Power converter circuits may be used to convey power from a source, such as a battery, power supply, electrical power grid, etc. to a load, such as any device, apparatus, or component that runs on electricity preferably with as little loss as possible. Generally, a power converter circuit provides an output voltage that has a different level than the input voltage. One type of power converter circuit is a Direct Current to Direct Current (DC to DC) circuit. DC to DC power converters typically operate by temporarily storing input energy from a power source and then releasing that energy to an output load at a different voltage level. Switched mode DC to DC converter circuits are generally more power efficient than linear voltage regulators, which dissipate unwanted power as heat. It is generally desirable to operate switched mode power converter circuits at higher frequencies as the component size and weight of such circuits can be reduced by, for example, eliminating low frequency transformers.

Many power converter circuits include some type of overcurrent fault protection. Fault protection may be even more important when wide bandgap transistors are used as switching transistors in a power converter circuit. The fault current slew rate of wide bandgap devices can be much higher than those comprising silicon. Wide bandgap devices also typically have lower thermal capacitance due to their small size, which can limit the survivable overcurrent fault duration. One approach for overcurrent protection is known as desaturation detection, which involves sensing the drain terminal voltage when the device enters the saturation region when applied to MOSFET like devices. Other approaches have used current shunts, common-source inductance voltage, or gate charge. Desaturation protection has been implemented for GaN FET-based power converters. The desaturation detection circuit's sensing diode typically requires significant settling time after the drain terminal voltage falls in turn-on transients. This diode also adds capacitive loading in parallel with the output capacitance, which may increase switching loss. Desaturation protection is generally most effective when the fault threshold current matches the saturation current at the selected gate driving voltage. This may pose a challenge for wide bandgap devices, such as GaN devices. In addition, this saturation current is generally temperature dependent in wide bandgap devices, such as GaN devices, which may complicate the selection of a fault current threshold.

SUMMARY

In some embodiments of the inventive concept, a power converter circuit comprises a switch comprising a field effect transistor, the field effect transistor being a wide bandgap field effect transistor and being configured to maintain an on operational state responsive to a maintenance signal received through a gate terminal, a current sensing circuit that is configured to estimate a drain terminal current of the field effect transistor responsive to a voltage between the gate terminal of the field effect transistor and a source terminal of the field effect transistor, and a gate driving circuit that is configured to generate the maintenance signal responsive to the estimate of the drain terminal current.

In other embodiments, the current sensing circuit is further configured to generate a sensing output signal based on a comparison of the voltage between the gate terminal of the field effect transistor and a source terminal of the field effect transistor and a voltage threshold. The power converter circuit further comprises a control circuit that is configured to generate a gate driver control signal responsive to the sensing output signal.

In still other embodiments, the gate driving circuit is further configured to generate the gate current signal responsive to the gate driver control signal.

In still other embodiments, the power converter circuit further comprises a first Galvanic isolator module that couples the current sensing circuit to the control circuit and a second Galvanic isolator module that couples the control circuit to the gate driving circuit.

In still other embodiments, the field effect transistor comprises a GaN Gate Injection Transistor (GIT).

In still other embodiments, the current sensing circuit is further configured to estimate the drain terminal current of the field effect transistor based on an estimate of a resistance in a two-dimensional electron gas (2DEG) channel of the field effect transistor on a source terminal side of the gate terminal of the field effect transistor.

In still other embodiments, the field effect transistor is a first field effect transistor. The power converter circuit further comprises a storage component and a rectifier component comprising a second field effect transistor and having first and second bias states. The first field effect transistor the on operational state and an off operational state. The first and second field effect transistors comprise first and second high electron mobility transistors (HEMTs), respectively.

In still other embodiments, energy from a power source is stored in the storage component when the switch is configured in a first one of the on and off operational states and the rectifier component is in the first bias state and the stored energy in the storage component is released to a load when the switch is configured in a second one of the on and off operational states and the rectifier component is in the second bias state.

In still other embodiments, the second HEMT comprises at least one heterojunction as a conducting channel.

In still other embodiments, the power converter circuit is a Direct Current to Direct Current (DC to DC) power converter circuit and the switch is operable in a hard switched mode.

In still other embodiments, the power converter circuit is a Direct Current to Direct Current (DC to DC) power converter and the switch is operable in a resonant switched mode.

In still other embodiments, the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration, or the power converter circuit is an Alternating Current (AC) to DC power converter circuit, or the power converter circuit is a DC to AC power converter circuit.

In still other embodiments, the storage component comprises a magnetic field storage component.

In still other embodiments, the magnetic field storage component comprises an inductor and/or a transformer.

In still other embodiments, the storage component comprises an electric field storage component.

In still other embodiments, the electric field storage component comprises a capacitor.

In some embodiments of the inventive concept, a power converter circuit comprises a switch comprising a field effect transistor, the field effect transistor being a wide bandgap field effect transistor and being configured to maintain an on operational state responsive to a gate current signal received through a gate terminal, an overcurrent detection circuit that is configured to generate a comparison result based on a comparison between a voltage between the gate terminal of the field effect transistor and a source terminal of the field effect transistor and a reference voltage, and to generate an overcurrent fault signal in one of a first state and a second state based on the comparison result, and a gate driving circuit that is configured to generate the gate current signal responsive to the overcurrent fault signal being in the first state and to terminate the gate current signal responsive to the overcurrent fault signal being in the second state.

In further embodiments, the power converter circuit further comprises a control circuit that is configured to generate a gate driver control signal responsive to the overcurrent fault signal being in the first state.

In still further embodiments, the gate driving circuit is further configured to generate the gate current signal responsive to the gate driver control signal.

In still further embodiments, the power converter circuit further comprises a soft turn-off circuit that is configured to control a speed at which the voltage between the gate terminal of the field effect transistor and the source terminal of the field effect transistor is reduced responsive to the overcurrent fault signal being in the second state.

In still further embodiments, the power converter circuit further comprises a first Galvanic isolator module that couples the overcurrent detection circuit to the control circuit and a second Galvanic isolator module that couples the control circuit to the gate driving circuit.

In still further embodiments, the overcurrent detection circuit comprises a latching comparator circuit that is configured to generate the comparison result and to generate the overcurrent fault signal.

In still further embodiments, the power converter circuit further comprises a filter circuit between the gate terminal of the field effect transistor and an input of the latching comparator circuit.

In still further embodiments, the field effect transistor is a first field effect transistor. The soft turn-off circuit comprises a second field effect transistor having a drain terminal coupled to the gate terminal of the first field effect transistor and a source terminal coupled to the gate driving circuit and a soft turn-off driver that is configured to drive a gate terminal of the second field effect transistor responsive to the overcurrent fault signal.

In still further embodiments, the field effect transistor comprises a GaN Gate Injection Transistor (GIT).

In still further embodiments, the field effect transistor is a first field effect transistor. The power converter circuit further comprises: a storage component and a rectifier component comprising a second field effect transistor and having first and second bias states. The first field effect transistor the on operational state and an off operational state. The first and second field effect transistors comprise first and second high electron mobility transistors (HEMTs), respectively.

In still further embodiments, energy from a power source is stored in the storage component when the switch is configured in a first one of the on and off operational states and the rectifier component is in the first bias state and the stored energy in the storage component is released to a load when the switch is configured in a second one of the on and off operational states and the rectifier component is in the second bias state.

In still further embodiments, the power converter circuit is a Direct Current to Direct Current (DC to DC) power converter circuit and the switch is operable in a hard switched mode.

In still further embodiments, the power converter circuit is a Direct Current to Direct Current (DC to DC) power converter and the switch is operable in a resonant switched mode.

In still further embodiments, the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration or the power converter circuit is an Alternating Current (AC) to DC power converter circuit, or the power converter circuit is a DC to AC power converter circuit.

In still further embodiments, the storage component comprises a magnetic field storage component.

In still further embodiments, the magnetic field storage component comprises an inductor and/or a transformer.

In still further embodiments, the storage component comprises an electric field storage component.

In still further embodiments, the electric field storage component comprises a capacitor.

It is noted that aspects described with respect to one embodiment may be incorporated in different embodiments although not specifically described relative thereto. That is, all embodiments and/or features of any embodiments can be combined in any way and/or combination. Moreover, other methods, systems, circuits and/or articles of manufacture according to embodiments of the inventive concept will be or become apparent to one with skill in the art upon review of the following drawings and detailed description. It is intended that all such additional methods, systems, circuits and/or articles of manufacture be included within this description, be within the scope of the present inventive concept, and be protected by the accompanying claims. It is further intended that all embodiments disclosed herein can be implemented separately or combined in any way and/or combination.

BRIEF DESCRIPTION OF THE DRAWINGS

The accompanying drawings, which are included to provide a further understanding of the invention and are incorporated in and constitute a part of this application, illustrate certain embodiment(s) of the inventive concept.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Aspects described with respect to one embodiment may be incorporated in different embodiments although not specifically described relative thereto. That is, all embodiments and/or features of any embodiments can be combined in any way and/or combination. Like numbers refer to like elements throughout the description of the figures.

Embodiments of the inventive concept are described herein with respect to wide bandgap semiconductor devices. As used herein a wide bandgap semiconductor device has a bandgap of at least 3 eV.

Some embodiments of the present inventive concept may arise from the realization that a wide bandgap semiconductor device, such as a GaN Gate Injection Transistor (GaN GIT), may be used as a power converter switch and may be maintained in an ON state by providing a maintenance signal, e.g., a current, to the gate terminal. This current may keep the two-dimensional electron gas (2DEG) channel fully enhanced. The voltage developed at the gate terminal of the switching transistor may be used to determine or estimate the current flowing through the drain terminal of the switching transistor after the gate terminal voltage has recovered from the turn-on transient. Embodiments of the inventive concept may, therefore, provide current sensing and fault protection circuitry for power converter circuits that is based on determining drain current based on gate voltage of the switching transistor. Such circuitry, according to some embodiments of the inventive concept, may provide improved current sensing/fault detection and response as sensing diodes coupled to the drain terminal are not required. The current sensing and fault protection circuit embodiments may also provide negligible impact on switching performance and loss due to low capacitive loading. Moreover, embodiments of the inventive concept may provide the circuit or system designer with flexibility in selecting a maximum current threshold, which is generally independent of the gate driver circuit design or temperature. Desaturation protection schemes are generally limited in that the maximum current is the saturation current of the switching transistor at the selected driving voltage. As a result, a choice is made between faster switching (high gate voltage) or faster protection (low gate voltage).

Figure 1:
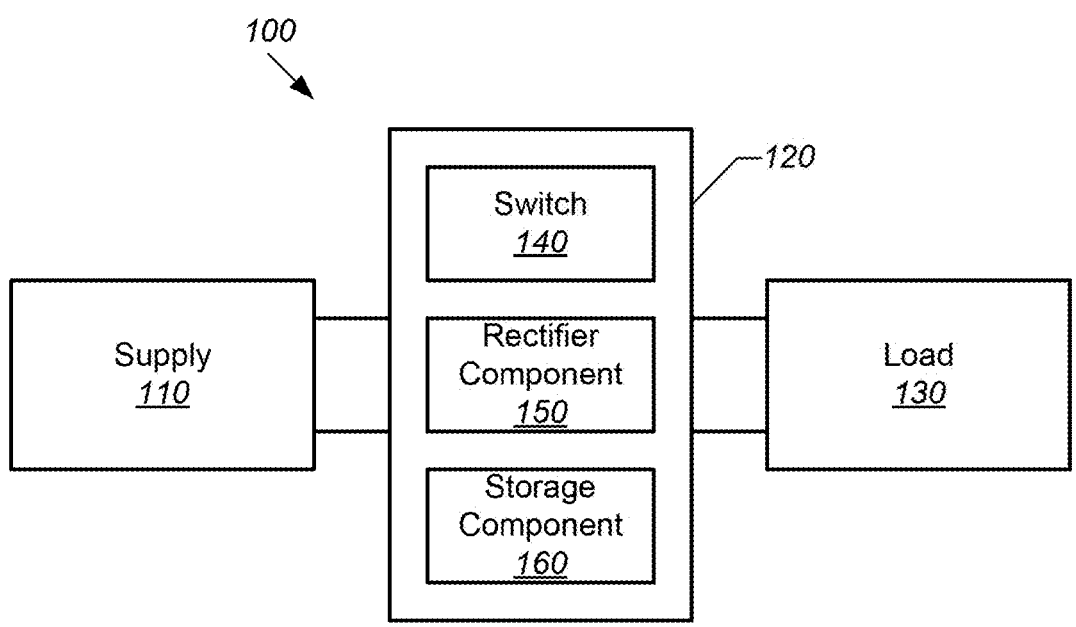
FIG. 1 is a block diagram of a power converter circuit that includes wide bandgap High Electron Mobility Transistors (HEMTs) for switching and rectification according to some embodiments of the inventive concept.

Referring now to FIG. 1, a power converter circuit 100, according to some embodiments of the present inventive concept, comprises a power supply 110, a converter circuit 120, and a load 130, which are connected as shown. The power supply 110 may be an Alternating Current (AC) or a Direct Current (DC) power supply. As shown in FIG. 1, the converter circuit 120 comprises a switch 140, a rectifier component 150, and a storage component 160. The load 130 may be any apparatus or device that receives the output voltage/current generated by the converter circuit 120 responsive to an input voltage/current received from the power supply 110. According to some embodiments of the present inventive concept, the switch 140 comprises at least one wide bandgap semiconductor device, such as a HEMT, and the rectifier component 150 comprises at least one HEMT. In some embodiments, the HEMTs used in the switch 140 and rectifier component 150 may be GaN devices. Each of the HEMTs may comprise at least one heterojunction as a conducting channel. The HEMT GaN device comprising the switch 140 may be a GaN GIT. In accordance with various embodiments of the present inventive subject matter, the storage component 160 may comprise a magnetic field storage component and/or an electric field storage component. In some embodiments, the magnetic field storage component comprises an inductor and/or transformer. In further embodiments, the electric field storage component comprises a capacitor.

Operations of the power converter circuit 100, according to some embodiments of the present inventive subject matter, will now be described. The switch 140 may be configured in at least two operational states, such as an open or closed state, on or off state, etc. The rectifier component 150 may be biased in at least two operational states, such as forward or reverse biased. When the switch 140 is in a first operational state, the rectifier component 150 is in a first bias state and energy from the power supply 110 is stored in the storage component 160. When the switch 140 transitions to the second operational state, the rectifier component 150 is in a second bias state and the energy stored in the storage component 160 is released to the load 130. The voltage/current delivered to the load 130 may be regulated based on the duty cycle of the switch 140, which is a fraction of time that the switch 140 is in one of its operational states.

Figure 2:
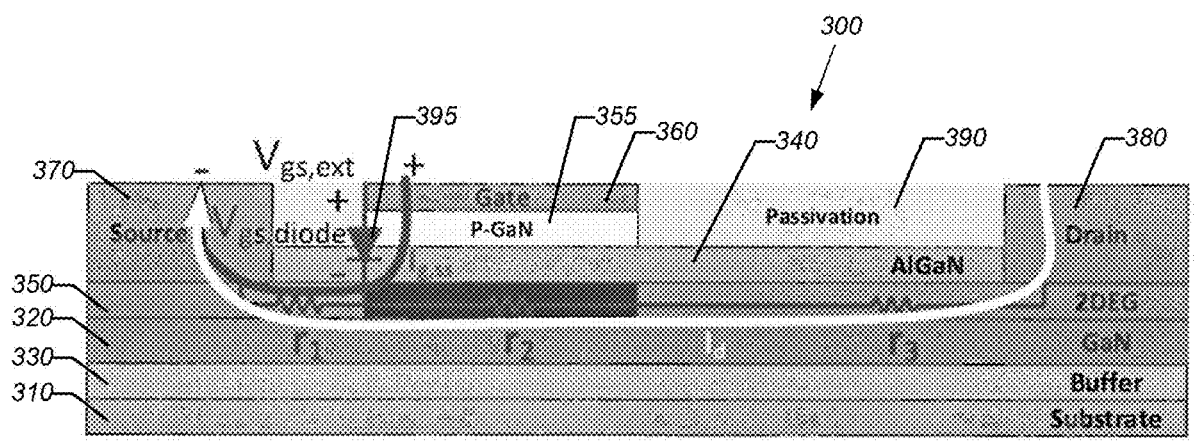
FIG. 2 is a cross sectional diagram of a GaN HEMT device that may be used in the switch of FIG. 2 according to some embodiments of the inventive concept.
Figure 3:
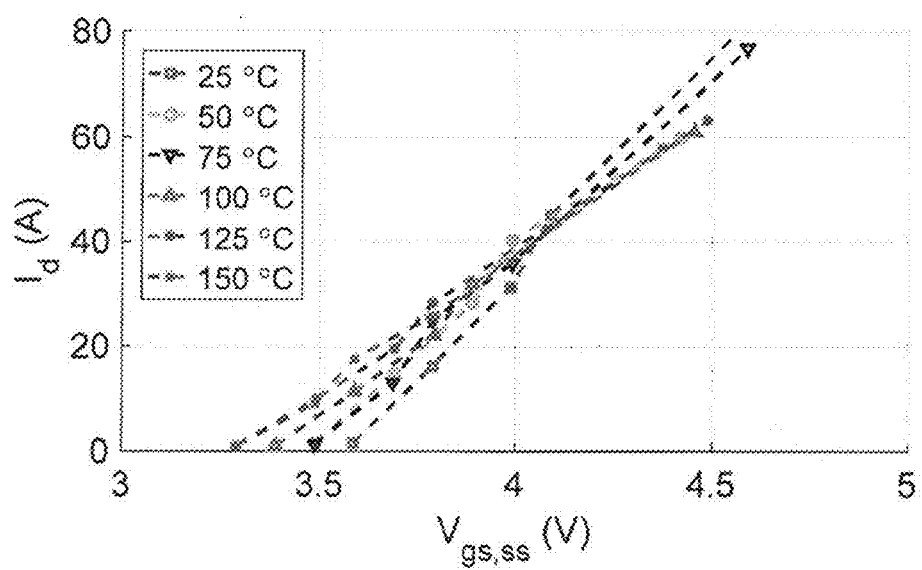
FIG. 3 is a graph that illustrates the relationship between drain terminal current and the steady state gate terminal voltage of the GaN HEMT device of FIG. 2 according to some embodiments of the inventive concept.

The converter circuit 120 may, in some embodiments, comprise a DC to DC power converter circuit and may be configured to operate, for example, in a hard switched mode or a resonant switched mode. In hard switched mode, the switch 140 switches between operational states at relatively high voltages and/or currents. In contrast, the switch 140 may be configured to operate in a resonant switched mode through use of an inductance-capacitance (LC) circuit that shapes the voltage/current applied to the switch so that the switch transitions between operational states when the voltage and/or the current is near zero. The DC to DC power converter circuit may be configured in, for example but not limited to, a Buck configuration, a Boost configuration, a Buck-Boost configuration, a Cuk configuration, a Single Ended Primary Inductor Converter (SEPIC) configuration, or a Zeta configuration. In other embodiments, the converter circuit 120 may be an Alternating Current (AC) to DC power converter circuit or a DC to AC power converter circuit FIG. 2 is a cross sectional diagram of a GaN GIT HEMT device. Referring now to FIG. 3, a substrate 310 is provided on which a transistor device may be formed. A channel layer 320 is formed on the substrate 310. The substrate 310 may comprise a semi-insulating substrate. The term "semi-insulating" is used descriptively herein, rather than in an absolute sense. In some embodiments of the inventive concept, the bulk crystal may have a resistivity equal to or higher than about $1 \times 10^5$ Ω-cm at room temperature.

It is to be understood that, although gallium nitride may be used as a substrate, embodiments of the inventive concept may use any suitable material for the substrate 310. Examples of suitable materials include, but are not limited to, silicon carbide (SiC), sapphire ($Al_2O_3$), aluminum nitride (AlN), aluminum gallium nitride (AlGaN), silicon (Si), gallium arsenide (GaAs), $Lu_2O_3/Ga_2O_3$ (LGO), zinc oxide (ZnO), $Lu_2O_3/Al_2O_3$ (LAO), indium phosphide (InP), and the like. It will be further understood that the presence of a growth substrate is optional, and the epitaxial layers of the device, including the channel layer 320, can be removed from a growth substrate and mounted on a carrier substrate, submount, package body or other support that may provide more suitable mechanical, thermal and/or electrical characteristics.

A buffer layer 330 may be disposed between the substrate 310 and channel 320. For example, an AlN buffer layer 330 may be provided to provide an appropriate crystal structure transition between the substrate 310 and the remainder of the device. Additionally, strain balancing transition layer(s) may also be provided.

The channel layer 320 may be deposited on the substrate 10 using buffer layers 330, transition layers, and/or nucleation layers. The channel layer 320 may be under compressive strain. Furthermore, the channel layer 320 and/or buffer layer 330 may be deposited by metal-organic chemical vapor deposition (MOCVD) or by other techniques known to those of skill in the art, such as molecular beam epitaxy (MBE) and/or hydride vapor phase epitaxy (HVPE). In some embodiments of the inventive concept, the channel layer 320 wide bandgap semiconductor material including, for example, many Group III-V and group II-V compounds. For example, the channel layer 320 may be a Group III-nitride layer, such as GaN. The channel layer 320 may also include other Group III-nitride layers, such as indium gallium nitride (InGaN), aluminum indium gallium nitride (AlInGaN), or the like. The channel layer 320 may be undoped (i.e., "unintentionally doped"), and may be grown to a thickness of greater than about 20 Å. The channel layer 20 may also be a multi-layer structure, such as a superlattice or combinations of GaN, AlGaN, or the like.

As further shown in FIG. 2, a barrier layer 340 is provided on the channel layer 320. For example, the barrier layer 340 may be epitaxially formed on the channel layer 320. The barrier layer 340 may be a Group III-nitride layer, such as $Al_xGa_{1-x}N$ (where 0<x<1). The barrier layer 22 may also include other Group III-nitride layers, such as AlInGaN, AlN, and/or combinations of layers thereof. The barrier layer 340 may, for example, be from about 0.1 nm to about 100 nm thick, but may not be so thick as to cause cracking or substantial defect formation therein. In certain embodiments of the inventive concept, the barrier layer 340 may be a highly-doped n-type layer. For example, the barrier layer 340 may be doped to a concentration of less than about $10^{19}$ $cm^{-3}$.

Some embodiments of the present invention may be applicable for use in HEMTs. More particularly, the channel layer 320 and the barrier layer 340 may be formed of materials having different bandgaps, such that an interface between the channel layer 320 and the barrier layer 340 defines a heterojunction. For example, the channel layer 320 may have a bandgap that is less than the bandgap of the barrier layer 340. As such, the energy of the conduction band edge of the channel layer 320 may be less than the energy of the conduction band edge of the barrier layer 340 at the junction between the channel 320 and barrier 340 layers, and the channel layer 320 may have a greater electron affinity than the barrier layer 340. For example, where both the channel layer 320 and the barrier layer 340 are formed of Group III-nitride layers, the channel layer 320 may be a GaN layer, and the barrier layer 340 may be a AlGaN layer.

In particular embodiments of the inventive concept, the barrier layer 340 may have a thickness, Al composition, and/or doping sufficient to induce a significant carrier concentration at the interface between the channel layer 320 and the barrier layer 340 through polarization effects when the barrier layer 340 is buried under ohmic contact metal. Also, the barrier layer 340 may be thick enough to reduce or minimize scattering of electrons in the channel 320 due to ionized impurities deposited at the interface between the barrier layer 320 and any subsequently formed protective layer.

In addition, in other embodiments of the inventive concept, the channel layer 320 and the barrier layer 340 may have different lattice constants. For example, the barrier layer 340 may be a relatively thin layer having a smaller lattice constant than the channel layer 320, such that the barrier layer 340 "stretches" at the interface between the two. Accordingly, a pseudomorphic HEMT (pHEMT) device may be provided.

In a HEMT device, a two-dimensional electron gas (2DEG) 350 may be formed at the heterojunction of two semiconductor materials with different bandgap energies. The smaller bandgap material may have a higher electron affinity than the wider bandgap material. The 2DEG is an accumulation layer in the undoped ("unintentionally doped") smaller bandgap material, and can contain a relatively high sheet electron concentration, for example, in excess of $10^{13}$ carriers/$cm^2$. Additionally, electrons that originate in the wider bandgap semiconductor may transfer to the 2DEG, allowing a relatively high electron mobility due to reduced ionized impurity scattering. This combination of relatively high carrier concentration and relatively high carrier mobility can give the HEMT a relatively large transconductance, and may provide a performance advantage over metal-semiconductor field effect transistors (MESFETs) for high-frequency applications.

High electron mobility transistors fabricated in the gallium nitride/aluminum gallium nitride (GaN/AlGaN) material system can generate large amounts of Radio Frequency (RF) power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

As shown in FIG. 2, the GaN HEMT device 300 may be configured as a GaN GIT HEMT device that includes a p-doped GaN layer 355 beneath a gate terminal 360. Between the source terminal 370 and the drain terminal 380. A passivation layer 390 fills the region between the gate terminal 360 and source/drain terminals 370, 380. The p-doped GaN layer beneath the gate shifts the threshold positively to make the device enhancement-mode. The cause of this positive shift is the diode 395 created at the junction of the p-GaN layer 350 and the AlGaN barrier layer 340, which may be forward biased with a small current to complete the 2DEG channel and turn the device on. Because the effective diode 395 occurs between the gate terminal 360 and the AlGaN barrier layer 340 beneath it, a portion of the total 2DEG channel resistance is located in series between this diode 395 and the source terminal 370 (or "Source Sense" pad, in the case of a four-terminal device with a Kelvin source). The distributed resistance of the 2DEG channel can be represented by three lumped parameters: r2 is the portion directly beneath the gate terminal 360, which is depleted by the reverse-biased diode 395 when the device is turned off; r1 is the portion on the source terminal 370 side of the gate terminal 360; and r3 is the portion on the drain terminal 380 side of the gate terminal 360. The lumped resistances r1 and r3 also include the contact metallizations and any other resistances between the 2DEG channel and the source and the drain terminals 370, 380. The typical gate drive circuit for a GIT HEMT device provides a transient voltage pulse to the gate terminal 360 at the moment of turn-on to enable fast and low-loss switching. Once this pulse decays, the driver provides a steady-state current to the gate, Ig,ss. This current may be in the range of about 10-50 mA, and may keeps the diode 395 forward-biased for full enhancement of the 2DEG channel. The driver may be configured to provide whatever voltage is needed between the gate and source terminals to provide this steady state current, typically in the range of about 2.5-5 V. This voltage varies with Ig,ss, as well as temperature and output conditions. Because of the location of r1 within the gate loop, this resistance acts as a current shunt to sense the total current flowing through it, as given by Equation 1:

$$V_{gs} = V_{gs,diode} + (I_d + I_g) r1 \quad \text{EQ. 1}$$

Because Ig,ss may be in the mA range, this means that the externally applied gate voltage Vgs,ss (steady state) can be approximated using Equation 2:

$$V_{gs,ss} = V_{gs,diode} + I_d r1 \quad \text{EQ. 2}$$

Thus, according to some embodiments of the inventive concept, once the turn-on transient is complete, the gate terminal 360 voltage can be used to sense the drain terminal 380 current and/or detect an overcurrent or short circuit condition based on the relationship between gate terminal 360 voltage and drain terminal 380 current expressed above in Equation 2.

The relationship between the drain terminal 380 current Id and the gate terminal voltage in steady state Vgs,ss has been confirmed with both static and dynamic characterization results. FIG. 3 is a graph of the drain terminal 380 current Id versus the steady state gate terminal 360 voltage Vgs,ss obtained from testing with a curve tracer on a GIT HEMT with a sweep of junction temperatures and drain currents. As shown in FIG. 3, the relationship between the drain terminal 380 current Id and the steady state gate terminal 360 voltage Vgs,ss matches the linear correlation given by Equation 2, with r1 approximately equal to 14 mΩ. This correlation shows very little variance with temperature.

Figure 4:
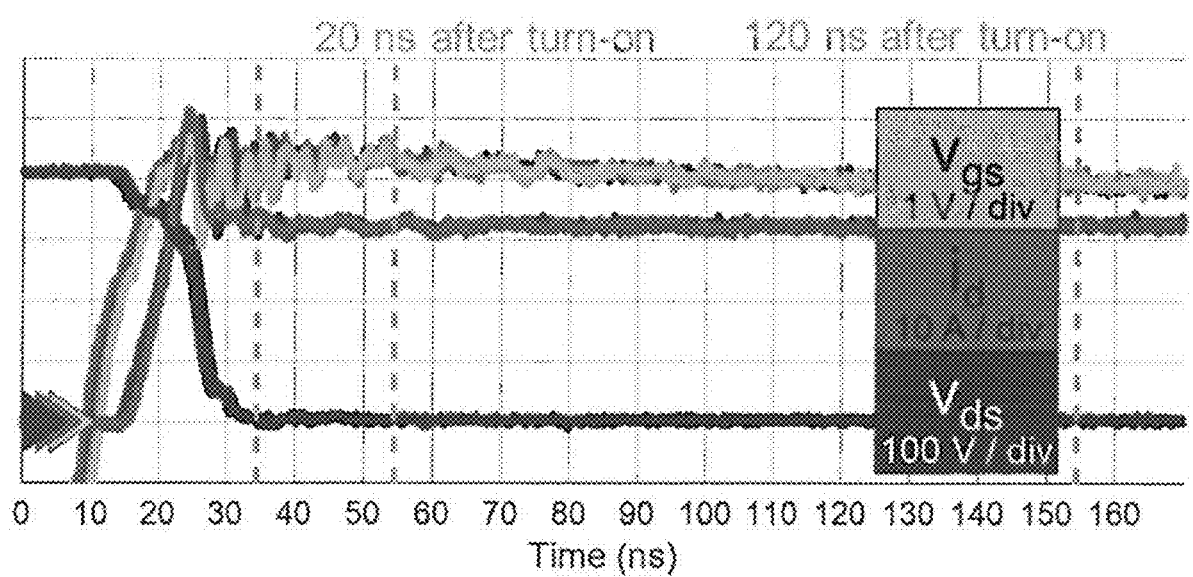
FIG. 4 is a graph that illustrates the transient gate terminal voltage of the GaN HEMT device of FIG. 2 during a transient period after turn-on corresponding to two different measurement intervals according to some embodiments of the inventive concept.

FIG. 4 is a graph that illustrates the transient gate terminal 360 voltage Vgs,ss during a transient period after turn-on corresponding to two different measurement intervals. The first samples of Vgs at correspond to 20 ns after the end of the turn-on transient (i.e. when vds reaches 0 V). At this time, the gate terminal 360 voltage is still recovering from the higher voltage pulse generated by the driver for fast turn-on, and is therefore higher than indicated by the static characterization results. The second samples correspond to 120 ns after the end of the turn-on transient, and the results match generally well with the static or steady state characterization across the full temperature range of FIG. 3.

Figure 5A:
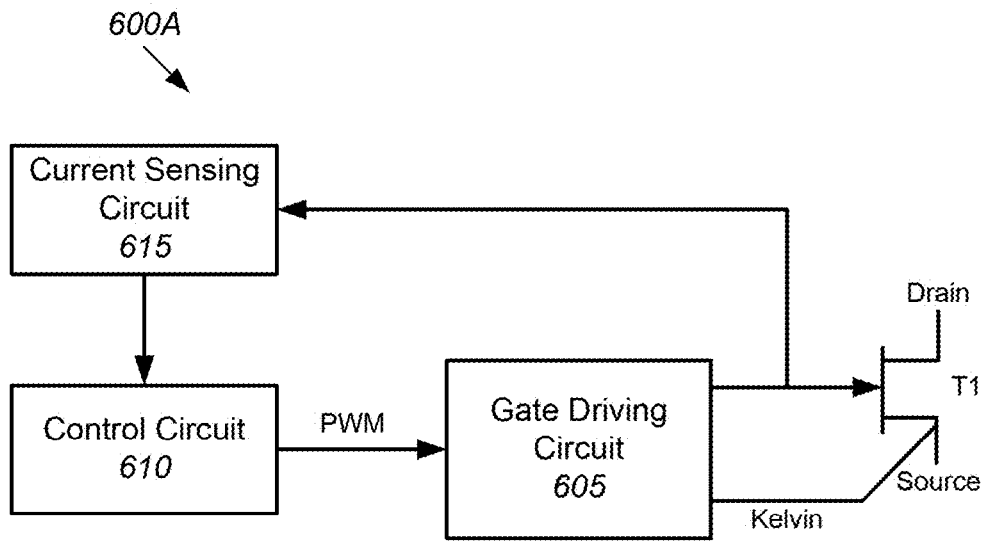
FIGS. 5A and 5B are block diagrams of power converter switch circuits including current sensing functionality in accordance with some embodiments of the inventive concept.

FIG. 5A is a block diagram of a power converter switch circuit 600A including current sensing functionality in accordance with some embodiments of the inventive concept. As shown in FIG. 5A, a transistor T1 may serve as a switch in a power converter circuit. The transistor T1 may be embodied as a semiconductor device that is configured to receive a non-zero gate current when the device is maintained in an "ON" state. In some embodiments, the transistor T1 is a GaN GIT (Gallium Nitride Gate Injection Transistor). A GaN GIT is a GaN based normally-off transistor device, more specifically, a normally-off HEMT (High Electron Mobility Transistor). The gate terminal of the transistor T1 may be viewed as a control node. A GaN GIT is a voltage controlled transistor device. That is, a GaN GIT switches between ON and OFF bias states dependent on a voltage level of a gate-source voltage $V_{gs}$ between the gate terminal and the source terminal. A p-type GaN GIT, which is a GIT with a p-doped gate electrode, switches ON when the gate-source voltage $V_{gs}$ is higher than a positive threshold voltage and switches off when the gate-source voltage $V_{gs}$ is below the threshold voltage. That is, the GaN GIT is in the OFF state, when the gate-source voltage $V_{gs}$ is 0 or negative. In the ON state, a steady current may flow into the gate node to maintain the ON state and/or to reduce the ON state resistance. Embodiments of power converter switch circuits are described herein by way of example in which the switch transistor is a GaN GIT with a p-doped gate electrode (i.e., p-doped GaN layer 355 of FIG. 2). It should be understood, however, that embodiments of the inventive concept are not limited to such power converter switch transistors, but may encompass generally transistor devices having wide bandgap characteristics, that may be maintained in an ON state via a gate terminal current.

The gate terminal of the transistor T1 is coupled to an output of a gate driving circuit 605. The gate driving circuit 605 is configured to generate a maintenance signal, such as, for example, a current output signal, responsive to a control signal, which is provided to the gate terminal of the transistor T1 to maintain the transistor T1 in an ON state. In other embodiments, the gate driving circuit 605 may be configured as a voltage-mode driver. The control signal, in some embodiments, may be a Pulse Width Modulation (PWM) signal that is generated by a control circuit 610. A current sensing circuit 615 is configured to read the voltage on the gate terminal of the transistor T1 to monitor the voltage across the gate and source terminals (or between the gate and Kelvin source terminals) $V_{gs}$. As described above with respect to FIG. 2 and Equation 2, the voltage developed across the gate and source terminals of the transistor T1 is proportional to the drain terminal current flowing through the transistor T1. The current sensing circuit 615 may perform additional analog processing on the $V_{gs}$ samples obtained from the transistor T1 and/or may process the $V_{gs}$ samples using an Analog-to-Digital (ADC) converter for further digital processing by a microcontroller, ASIC, or other type of processor unit. The current sensing circuit 615 may estimate or determine the drain terminal current and use this information for monitoring, fault protection, or other type of control decision. For example, as shown in FIG. 5A the current sensing circuit 615 may generate a sensing output signal that is provided to the control circuit 610. In response to this sensing output signal from the current sensing circuit 615, the control circuit 610 may generate the PWM signal so that the gate driving circuit 605 maintain the transistor T1 in an ON state or, for example, if the current sensing circuit 615 determines that the drain current has exceeded a threshold (e.g., when the $V_{gs}$ samples exceed a voltage threshold associated with a safe drain current threshold), then this information may be conveyed to the control circuit 610 by way of the sensing output signal thereby causing the control circuit 610 to generate the PWM signal that causes the gate driving circuit 605 to deactivate the transistor T1 by terminating the current output signal provided to the gate terminal.

Figure 5B:
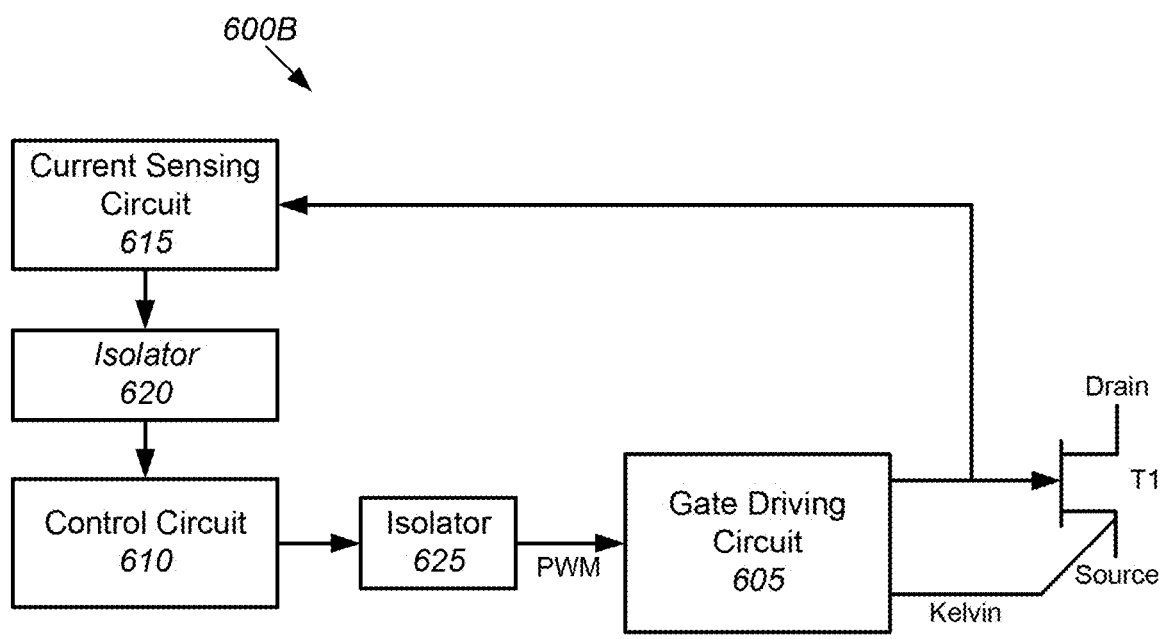

FIG. 5B is a block diagram of a power converter switch circuit 600B including current sensing functionality in accordance with some embodiments of the inventive concept. The power converter switch circuit 600B is similar in composition and operation to the power converter switch circuit 600A, with the exception that the power converter switch circuit 600B includes Galvanic isolators between the current sensing circuit 615 and the control circuit 610 (isolator 620) and between the control circuit 610 and the gate driving circuit 605 (isolator 625). Galvanic isolators may be used where two or more electric circuits must communicate, but their grounds may be at different potentials. It may be useful in preventing or reducing unwanted current from flowing between two units sharing a ground conductor.

Figure 6A:
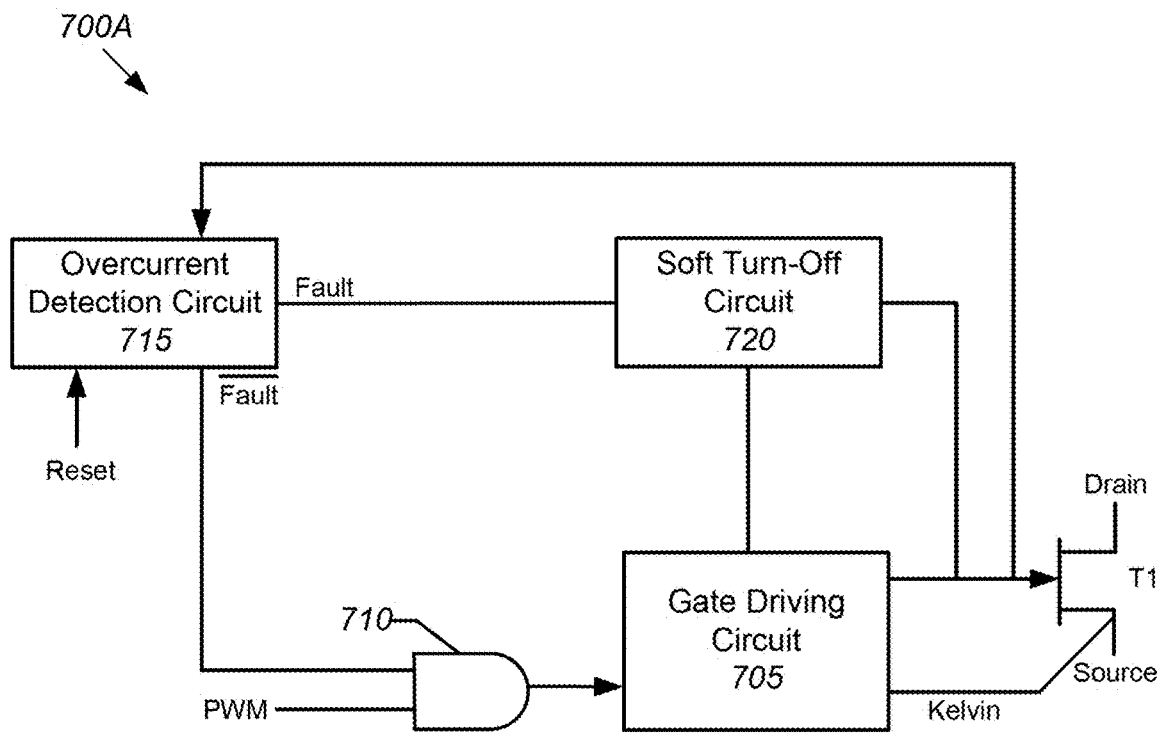
FIGS. 6A-6D are block diagrams of power converter switch circuits including overcurrent detection functionality in accordance with some embodiments of the inventive concept.

FIG. 6A is a block diagram of a power converter switch circuit 700A including overcurrent detection functionality in accordance with some embodiments of the inventive concept. As used herein, overcurrent detection encompasses faults in which a current surge may damage one or more switching transistors (or other circuit components) in a power converter. These faults may include, for example, short-circuit faults where multiple switches in a bridge are turned on simultaneously to allow a short circuit current to flow from the DC bus (sometimes referred to as the DC link, DC source, or DC capacitors) and this current is then dissipated in an uncontrolled way inside the switches. As shown in FIG. 6A, a transistor T1 may serve as a switch in a power converter circuit. Similar to FIGS. 5A and 5B, the transistor T1 may be embodied as a GaN GIT device. The gate terminal of the transistor T1 is coupled to an output of a gate driving circuit 705. The gate driving circuit 705 is configured to generate a maintenance signal, such as, for example, a current output signal responsive to a control signal, which is provided to the gate terminal of the transistor T1 to maintain the transistor T1 in an ON state. In other embodiments, the gate driving circuit 705 may be configured as a voltage-mode driver. The control signal, in some embodiments, may be a PWM signal that is generated by a logic circuit 710. An overcurrent detection circuit 715 is configured to read the voltage on the gate terminal of the transistor T1 to monitor the voltage across the gate and source terminals (or between the gate and Kelvin source terminals) $V_{gs}$. As described above with respect to FIG. 2 and Equation 2, the voltage developed across the gate and source terminals of the transistor T1 is proportional to the drain terminal current flowing through the transistor T1. The overcurrent detection circuit 715 may perform additional analog processing on the $V_{gs}$ samples obtained from the transistor T1 and/or may then process the $V_{gs}$ samples using an Analog-to-Digital (ADC) converter for further digital processing by a microcontroller, ASIC, or other type of processor unit. The overcurrent detection circuit 715 may be configured to determine whether the current flowing through the drain terminal of the switching transistor T1 is greater than a threshold that would indicate an overcurrent event based on the $V_{gs}$ samples. The threshold may be selected, for example, based on Equation 2 set forth above and also on experimental data for a particular device, such as the data illustrated in the graph of FIG. 3 for the transistor T1, which shows the relationship between drain current, gate terminal voltage $V_{gs}$, and temperature for a given transistor T1. When an overcurrent event has been detected, the overcurrent detection circuit 715 may assert fault signals that are provided to the logic circuit 710 and a soft turn-off circuit 720. The logic circuit 710 may be operable to pass the PWM signal through to the gate driving circuit 705 unless the overcurrent detection circuit 715 asserts a fault. In this case, the PWM control signal is blocked causing the gate driving circuit 705 to cease providing the current output signal to the gate terminal of the transistor T1. Turning off the transistor T1 too quickly in response to a short-circuit fault, for example, may result in a high drain terminal voltage overshoot that damages or destroys the transistor T1 from overvoltage rather than overcurrent. The soft turn-off circuit 720 may be configured to control the speed at which the voltage at the gate terminal of the transistor T1 is lowered in response to an overcurrent event. In addition to the turning off the transistor T1, the overcurrent detection circuit 715 may also report the overcurrent event to other circuits, modules, application programs, etc. A reset signal may be generated to reset the overcurrent detection circuit 715 after an overcurrent event has passed and the drain terminal current of the transistor T1 has fallen to safe levels.

Figure 6B:
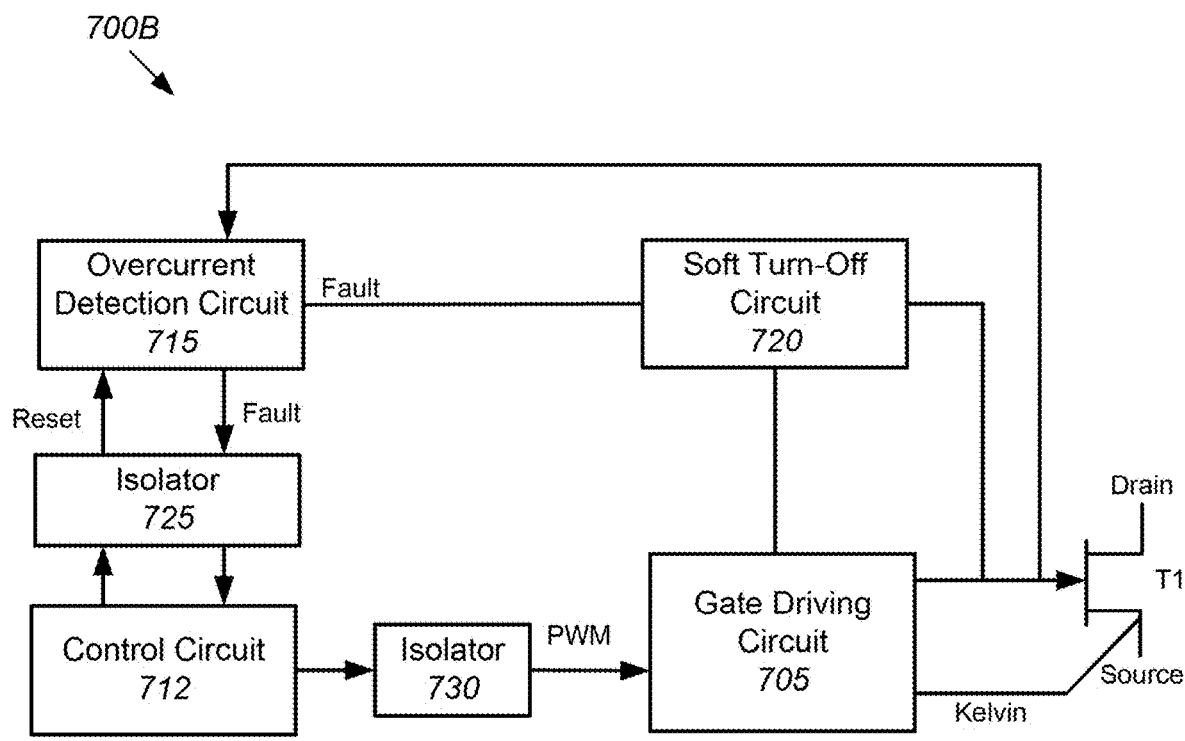

FIG. 6B is a block diagram of a power converter switch circuit 700B including overcurrent detection functionality in accordance with some embodiments of the inventive concept. The power converter switch circuit 700B is similar in composition and operation to the power converter switch circuit 700A, with the exception that the functionality of the logic circuit 710 is replaced with a general control circuit 712, which may include one or more logic circuits, and the power converter switch circuit 700B includes Galvanic isolators between the overcurrent detection circuit 715 and the control circuit 712 (isolator 725) and between the control circuit 712 and the gate driving circuit 705 (isolator 730).

Figure 6C:
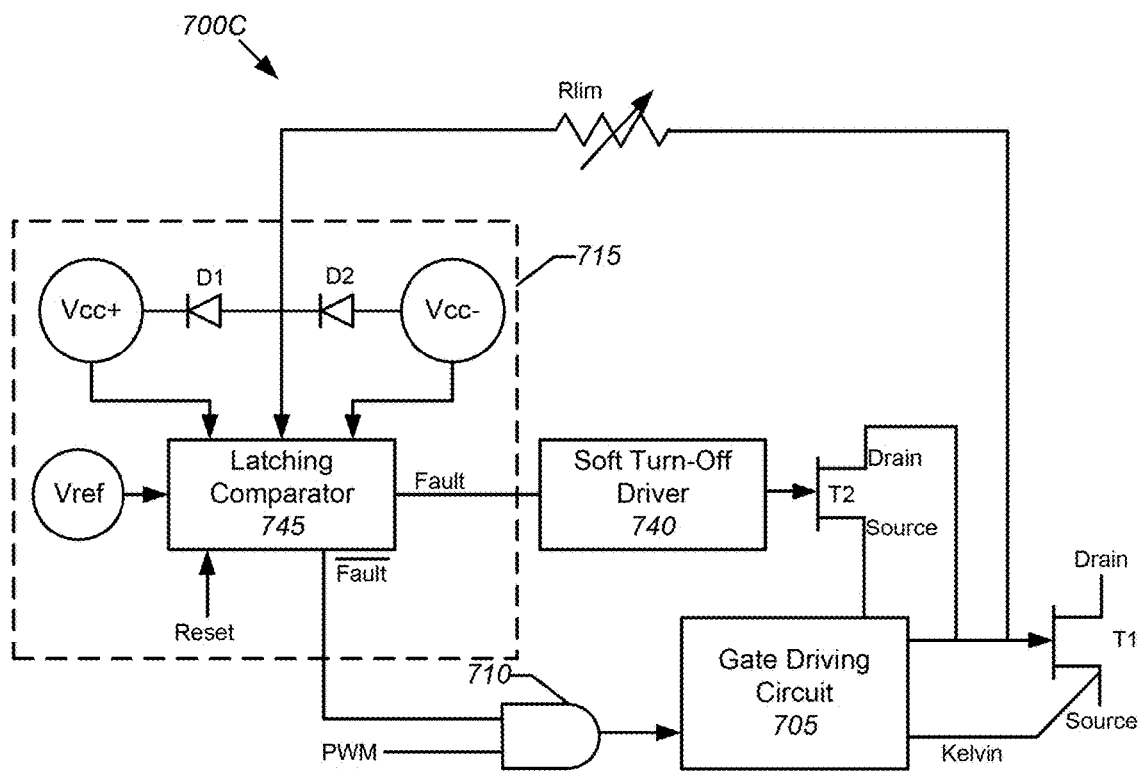

FIG. 6C is a block diagram and schematic of a power converter switch circuit 700C including overcurrent detection functionality in accordance with some embodiments of the inventive concept. FIG. 6C comprises the power converter switch circuit 700A of FIG. 6A and includes example embodiments of the overcurrent detection circuit 715 and soft turn-off circuit 720. As shown in FIG. 6C, the overcurrent detection circuit includes a latching comparator that compares a reference voltage $V_{ref}$ with the voltage read from the gate terminal of the transistor T1 to determine if the drain current through the transistor T1 has exceeded a threshold. That is, if the gate terminal voltage of the transistor T1 has exceeded a particular threshold, which may correspond to the reference voltage $V_{ref}$, then an overcurrent event is recognized and a fault signal is asserted. As described above, the reference voltage $V_{ref}$ may be selected, for example, based on Equation 2 and also on experimental data for a particular device, such as the data illustrated in the graph of FIG. 3 for the transistor T1, which shows the relationship between drain current, gate terminal voltage $V_{gs}$, and temperature for a given transistor T1. The resistor Rum and diodes D1 and D2 between the two power supply sources $V_{cc+}$ and $V_{cc-}$ may provide a filter circuit that is used to provide blanking time by filtering out noise, spikes, and the gate overshoot experienced during the turn-on transient, which has been described above with respect to FIG. 4. The diodes D1 and D2 may provide capacitance, which cooperates with the resistor $R_{lim}$ to provide an RC filter circuit. The diodes D1 and D2 may also protect the latching comparator 745 from potential spikes in the gate terminal voltage $V_{gs}$. In some embodiments, the diodes may provide capacitance of approximately 80 pF and the resistor $R_{lim}$ may be a variable resistor with a range of approximately 0.5-1.0 kΩ. The soft turn-off circuit 720 comprises a soft turn-off driver circuit 740 and a MOSFET T2 that are connected as shown in FIG. 6C. The MOSFET T2 is used to control the speed of the turn-off of the transistor T1 by operating the MOSFET T2 in the saturation region to provide an approximately fixed quantity of current to bring the gate terminal voltage of the transistor T1 down slowly.

The source of the MOSFET T2 may be connected to a pull-down voltage source $V_s$ and its gate voltage may be controlled by a logic gate in the soft turn-off driver 740 driven by the latching comparator 745 fault signal. This logic gate may output a voltage Vcc- (−5 V in this case) during normal operation, and 0 V when a fault occurs. Referenced to Vs (which may be −3 V), the T2 MOSFET's $V_{gs}$ is, therefore, −2 V during normal operation and 3 V when a fault occurs. In some embodiments, the MOSFET T2 may have a threshold voltage of 0.8-1.5 V and provide 300 mA of drain current when operated in saturation with Vgs=3 V from 25 to 100° C. The MOSFET T2 may draw enough current to slowly bring down the faulted T1 transistor's gate voltage, but it may also absorb the steady-state current provided by the gate driving circuit 705 (e.g., approximately 25 mA). To prevent damage to the MOSFET T2, this current must be terminated at some time after triggering a soft turn-off operation. The latching comparator 745 may be configured to provide a delayed output that turns off the gate driving circuit 705. This delay may be adjusted to allow the STO operation to complete. In some embodiments, this delay may be approximately ~200 nanoseconds. In some embodiments, the speed of the soft turn-off operation may be adjusted based on the size of the transistor T2 and/or the voltage level provided to the soft turn-off driver circuit 740. In other embodiments, a resistor may be inserted in series with either of the drain or source terminals of the transistor T2 to adjust the speed of the soft turn-off operation.

Figure 6D:
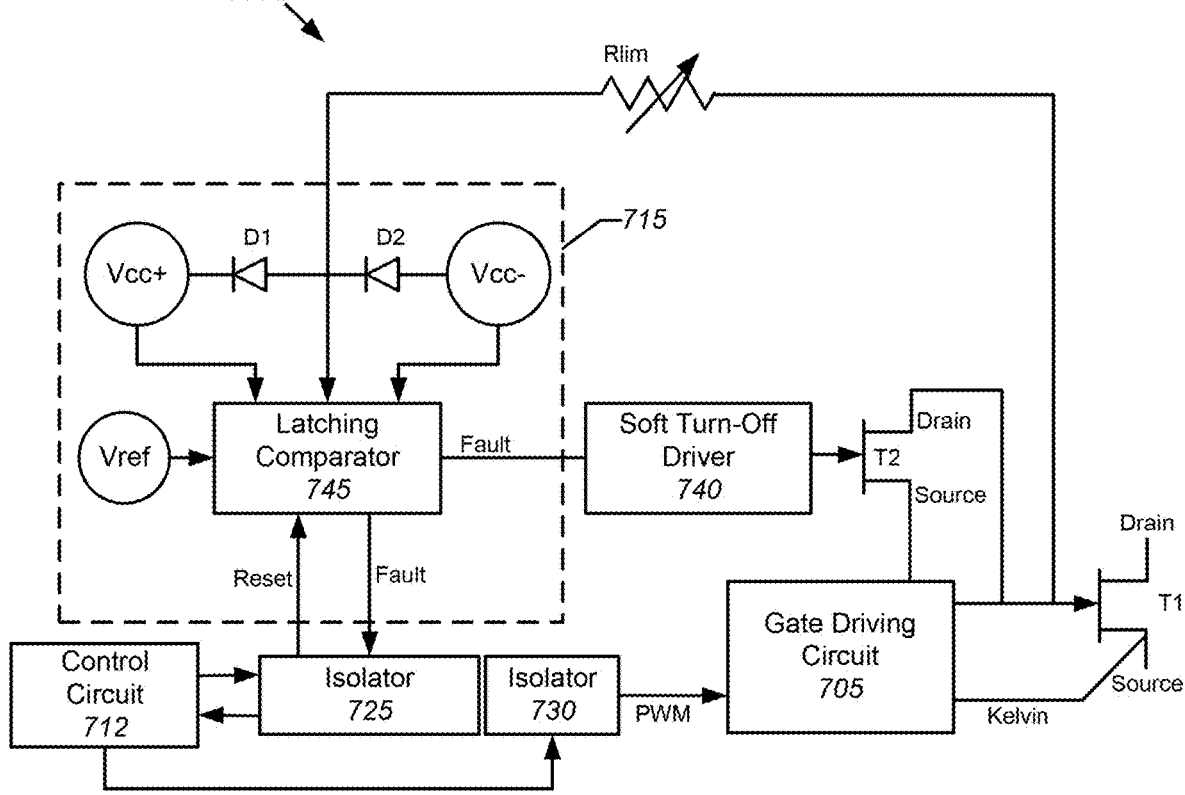

FIG. 6D is a block diagram of a power converter switch circuit 700D including overcurrent detection functionality in accordance with some embodiments of the inventive concept. The power converter switch circuit 700D is similar in composition and operation to the power converter switch circuit 700C, with the exception that the functionality of the logic circuit 710 is replaced with a general control circuit 712, which may include one or more logic circuits, and the power converter switch circuit 700D includes Galvanic isolators between the overcurrent detection circuit 715 and the control circuit 712 (isolator 725) and between the control circuit 712 and the gate driving circuit 705 (isolator 730).

The power converter switch circuit 700C of FIG. 6C was tested under a voltage of 400 V with a load inductor connected to the switching transistor T1. The 400 V source was applied to the load via a PWM control input with increasing pulse duration to increase the current through the load inductor. The response time was determined by recording the longest single pulse that did not trigger fault protection and comparing it to the longest possible pulse when the fault protection was triggered. The threshold current was defined as the drain current reached during the longest single non-fault pulse, and then the maximum fault current was defined as the peak current in the faulted case. The current ramp rate was varied by replacing the load with different inductances. The response time appears to asymptotically approach ~60 ns as the current ramp rate increases, which fits well with the expected propagation delay of 55-75 ns. With higher fault current ramp rates, the impact of filtering on the sensed $V_{gs}$ may become less significant, and the effective blanking time approaches 0 ns. In this case, the total response time is made up of only the propagation delays of the protection circuit.

Noise immunity of the power converter switch circuit 700C of FIG. 6C was verified by applying a total of 40 pulses with a 400 V DC bus and a steadily increasing drain terminal current with each pulse. The power converter switch circuit 700C tripped (i.e., asserted a fault condition) after 28 pulses and blocked the PWM signal for the remaining 12 pulses. The drain current reached a maximum of 31.2 A before the circuit asserted a fault condition. Despite the hard turn-on and turn-off transients occurring with each pulse, the power converter switch circuit 700C asserted a fault only when the drain terminal current exceeded the threshold for longer than the blanking time.

In addition to relatively fast response and relatively high noise immunity, the power converter switch circuit 700C of FIG. 6C has a generally negligible impact on switching loss. Fault protection circuits based on desaturation protection may add capacitive loading to the drain terminal of the switching transistor, which may lead to increased hard switching losses. Embodiments of the present inventive concept introduce additional load at the gate terminal of the switching transistor and the current limiting resistor ($R_{lim}$) generally limits the fault protection circuitry from drawing more than a few mA from the gate driving circuit 705 output.

Some embodiments of the inventive concept may provide a current sensing and fault protection circuit that determine the drain current and/or detect overcurrent conditions in a field effect transistor, such as a GaN GIT device, that may be used in a relatively high voltage switching application. The embodiments may be used generally with any type of wide bandgap semiconductor device that may be maintained in an ON state via a gate terminal current. When embodied using a GaN GIT switching transistor, the current sensing and protection circuitry may respond in nanoseconds to overcurrent events. The current sensing and protection circuitry does not add any additional components in the power loop or add any additional loading to the drain terminal of the switching transistor. As a result, there is negligible impact on the turn-on and turn-off speed, switching loss, or other functionality of the power converter circuit.

Further Definitions and Embodiments

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some embodiments of the invention may be described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

In the drawings and specification, there have been disclosed typical embodiments of the inventive subject matter, and, although specific terms are used, they are used in a generic and descriptive sense only and not for purposes of limitation, the scope of the invention being set forth in the following claims.

That which is claimed:

1. A power converter circuit, comprising:
a switch comprising a field effect transistor, the field effect transistor being a wide bandgap field effect transistor and being configured to maintain an on operational state responsive to a maintenance signal received through a gate terminal;
a current sensing circuit that is configured to read a value of a voltage between the gate terminal of the field effect transistor and a source terminal of the field effect transistor, to estimate a drain terminal current of the field effect transistor using the read value of the voltage between the gate terminal of the field effect transistor and the source terminal of the field effect transistor and to generate a sensing output signal based on a comparison of the read value of the voltage between the gate terminal of the field effect transistor and the source terminal of the field effect transistor and a voltage threshold;
a control circuit that is configured to generate a gate driver control signal responsive to the sensing output signal; and
a gate driving circuit that is configured to generate the maintenance signal responsive to the estimate of the drain terminal current;
wherein the gate driving circuit is further configured to generate the maintenance signal responsive to the gate driver control signal.

2. The power converter circuit of claim 1, wherein the field effect transistor comprises a GaN Gate Injection Transistor (GIT).

3. The power converter circuit of claim 1, wherein the field effect transistor is a first field effect transistor;
wherein the power converter circuit further comprises:
a storage component; and
a rectifier component comprising a second field effect transistor and having first and second bias states;
wherein the first field effect transistor the on operational state and an off operational state; and
wherein the first and second field effect transistors comprise first and second high electron mobility transistors (HEMTs), respectively.

4. The power converter circuit of claim 3, wherein energy from a power source is stored in the storage component when the switch is configured in a first one of the on and off operational states and the rectifier component is in the first bias state and the stored energy in the storage component is released to a load when the switch is configured in a second one of the on and off operational states and the rectifier component is in the second bias state.

5. The power converter circuit of claim 3, wherein the second HEMT comprises at least one heterojunction as a conducting channel.

6. The power converter circuit of claim 3, wherein the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration; or
wherein the power converter circuit is an Alternating Current (AC) to DC power converter circuit; or
wherein the power converter circuit is a DC to AC power converter circuit.

7. A power converter circuit, comprising:
a switch comprising a field effect transistor, the field effect transistor being a wide bandgap field effect transistor and being configured to maintain an on operational state responsive to a gate current signal received through a gate terminal;
an overcurrent detection circuit that is configured to read a value of a voltage between the gate terminal of the field effect transistor and a source terminal of the field effect transistor and to generate a comparison result based on a comparison between the read value of the voltage between the gate terminal of the field effect transistor and the source terminal of the field effect transistor and a reference voltage, and to generate an overcurrent fault signal in one of a first state and a second state based on the comparison result; and a gate driving circuit that is configured to generate the gate current signal responsive to the overcurrent fault signal being in the first state and to terminate the gate current signal responsive to the overcurrent fault signal being in the second state;

wherein the overcurrent detection circuit comprises:

a latching comparator circuit that is configured to generate the comparison result and to generate the overcurrent fault signal;

wherein the power converter circuit further comprises:

a filter circuit between the gate terminal of the field effect transistor and an input of the latching comparator circuit.

8. The power converter circuit of claim 7, further comprising:

a control circuit that is configured to generate a gate driver control signal responsive to the overcurrent fault signal being in the first state.

9. The power converter circuit of claim 8, wherein the gate driving circuit is further configured to generate the gate current signal responsive to the gate driver control signal.

10. The power converter circuit of claim 8, further comprising:

a soft turn-off circuit that is configured to control a speed at which the voltage between the gate terminal of the field effect transistor and the source terminal of the field effect transistor is reduced responsive to the overcurrent fault signal being in the second state.

11. The power converter circuit of claim 10, further comprising:

a first Galvanic isolator module that couples the overcurrent detection circuit to the control circuit; and a second Galvanic isolator module that couples the control circuit to the gate driving circuit.

12. The power converter circuit of claim 7, wherein the field effect transistor is a first field effect transistor;

wherein the power converter circuit further comprises:

a storage component; and a rectifier component comprising a second field effect transistor and having first and second bias states;

wherein the first field effect transistor the on operational state and an off operational state; and wherein the first and second field effect transistors comprise first and second high electron mobility transistors (HEMTs), respectively.

13. The power converter circuit of claim 12, wherein energy from a power source is stored in the storage component when the switch is configured in a first one of the on and off operational states and the rectifier component is in the first bias state and the stored energy in the storage component is released to a load when the switch is configured in a second one of the on and off operational states and the rectifier component is in the second bias state.

14. The power converter circuit of claim 12, wherein the power converter circuit is a Direct Current to Direct Current (DC to DC) power converter circuit and the storage component, the rectifier, and the switch are configured in a Buck configuration, a Boost configuration, a Buck-Boost configuration, a Cuk configuration, a Single Ended Primary Inductor Converter (SEPIC) configuration, or a Zeta configuration; or wherein the power converter circuit is an Alternating Current (AC) to DC power converter circuit; or wherein the power converter circuit is a DC to AC power converter circuit.

15. The power converter circuit of claim 7, wherein the field effect transistor is a first field effect transistor; and wherein the soft turn-off circuit comprises:

a second field effect transistor having a drain terminal coupled to the gate terminal of the first field effect transistor and a source terminal coupled to the gate driving circuit; and a soft turn-off driver that is configured to drive a gate terminal of the second field effect transistor responsive to the overcurrent fault signal.

16. The power converter circuit of claim 7, wherein the field effect transistor comprises a GaN Gate Injection Transistor (GIT).

17. A power converter circuit, comprising:

a switch comprising a field effect transistor, the field effect transistor being a wide bandgap field effect transistor and being configured to maintain an on operational state responsive to a maintenance signal received through a gate terminal;

a current sensing circuit that is configured to read a value of a voltage between the gate terminal of the field effect transistor and a source terminal of the field effect transistor and to estimate a drain terminal current of the field effect transistor using the read value of the voltage between the gate terminal of the field effect transistor and the source terminal of the field effect transistor; and a gate driving circuit that is configured to generate the maintenance signal responsive to the estimate of the drain terminal current;

wherein the current sensing circuit is further configured to estimate the drain terminal current of the field effect transistor based on an estimate of a resistance in a two-dimensional electron gas (2DEG) channel of the field effect transistor on a source terminal side of the gate terminal of the field effect transistor.

* * * * *